(12) United States Patent
Kulhalli et al.

(10) Patent No.: US 6,489,813 B2
(45) Date of Patent: Dec. 3, 2002

(54) LOW POWER COMPARATOR COMPARING DIFFERENTIAL SIGNALS

(75) Inventors: Suhas R. Kulhalli, Karnataka (IN); Ravishankar S. Ayyagari, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/794,765

(22) Filed: Feb. 26, 2001

(65) Prior Publication Data

US 2002/0118048 A1 Aug. 29, 2002

(51) Int. Cl.[7] ............................................... H03K 5/153
(52) U.S. Cl. ........................... 327/77; 327/65; 327/337; 330/9
(58) Field of Search ............................ 327/337, 554, 327/63, 65, 67, 77, 87, 88, 89, 91, 94, 95, 96; 330/9, 51

(56) References Cited

U.S. PATENT DOCUMENTS

| | | | |
|---|---|---|---|
| 4,802,130 A | 1/1989 | Soneda | |
| 5,332,931 A | 7/1994 | Crispie et al. | |
| 5,525,920 A | * 6/1996 | Rakers et al. | 327/65 |
| 5,563,598 A | 10/1996 | Hickling | |
| 5,869,987 A | * 2/1999 | Tang | 327/77 |
| 5,912,567 A | 6/1999 | Drost et al. | |
| 6,040,793 A | * 3/2000 | Gerguson, Jr. et al. | 327/337 |
| 6,144,232 A | * 11/2000 | Yukawa et al. | 327/77 |
| 6,150,851 A | 11/2000 | Ohmi et al. | |
| 6,191,624 B1 | 2/2001 | Matsuya | |

* cited by examiner

Primary Examiner—Toan Tran
(74) Attorney, Agent, or Firm—J. Dennis Moore; W. James Brady, III; Frederick J. Telecky, Jr.

(57) ABSTRACT

A comparator comparing a differential input signal (represented by INM and INP single ended signals) with a differential reference signal (REFP and REFM) to generate a comparison result. The result may be amplified by a desired high amplification factor while consuming minimal electrical power. The comparator may contain two regenerative latches, with each latch containing two terminals. The INM, INP, REFP, and REFM are provided on the four terminals via respective switches. The first and second terminals of the first regenerative latch may respectively be connected to the first and second terminals of the second regenerative latch, with a switch in the path of each connection. The switches may be operated and the regenerative latches may be enabled for a short duration, to generate an amplified comparison result.

24 Claims, 3 Drawing Sheets

LOW POWER COMPARATOR COMPARING DIFFERENTIAL SIGNALS

BACKGROUND OF THE INVENTION

1. Field of the Invention

The present invention relates to comparators, and more specifically to a method and apparatus for comparing two differential signals while consuming low power.

2. Related Art

Comparators are often used to compare two input signals. A typical comparator compares two input signals and generates an output signal representing the comparison result. The input and output signals can be either single ended or differential as is well known in the relevant arts. A single ended signal commonly refers to a signal which uses ground level (or zero voltage) as a reference.

On the other hand, a differential signal is represented by two single ended signals, with the strength (e.g., voltage level) of the differential signal equaling the difference of the two single ended signals. By using the difference, any common noise in the two signals may be eliminated as is well known in the relevant arts.

In one prior embodiment, two differential signals are provided as inputs to a double differential amplifier modeled as having infinite (or high) gain, the output swings to + or − voltage level depending on the result of the comparison. Unfortunately, high gain amplifiers typically consume excessive electrical power and are unsuitable in several environments. For example, a charged coupled capacitor (CCD) camera may need to consume minimal power and yet need comparators within.

In an alternative prior embodiment, an amplifier with a relatively low gain (e.g., a gain of 10) is employed. Due to the low gain, the output of the amplifier reflects the result of the comparison, but may not have a desired level of voltage. For example, the voltage level may need to equal a logical level (e.g., 3 Volts) of a binary bit. The desired amplification may be achieved by providing the input to a regenerative latch which amplifies the signal. The signal is amplified in a short duration to the desired level due to the internal positive feedback.

One problem with such an alternative embodiment is that the input offset of the amplifier may be unacceptably high. An input offset generally refers to minimum voltage level difference that needs to be present between the two inputs for a comparison operation to be accurate. Ideally, the input offset should equal zero volts.

However, a lower input offset typically requires high power consumption as is well known in the relevant arts. As noted above, high power consumption is undesirable in several environments. Therefore, what is needed is a method and an apparatus for comparisons of two differential signals while minimizing offset and power.

SUMMARY OF THE INVENTION

A comparator provided in accordance with the present invention compares an input differential signal (represented by single-ended signals INP and INM) with a reference differential signal (represented by single-ended signals REFP or REFM), and generates a comparison result at a desired higher voltage level. A single ended signal (INP or INM) of the input differential signal is averaged with another single-ended signal (REFP or REFM) of the reference signal to generate a first average signal.

The remaining two single-ended signals (one each from the input differential signal and the reference differential signal) may also be averaged to generate a second average signal. The difference of the two averages may be amplified to generate the comparison result at the desired higher voltage level. To keep the averages within a low voltage range, each average is generated based on one positive single ended signal and a negative single ended signal.

In one embodiment, the comparator contains two regenerative latches. The first regenerative latch is coupled between a first node and a second node. The second regenerative latch is coupled between a third node and a fourth node. The first node is connected to the third node by a first φZ switch and the second node is connected to the fourth node by a second φZ switch.

The first regenerative latch is enabled and disabled according to a first φZD switch and the second regenerative latch is enabled and disabled according to a second φZD switch. Each of the four nodes may contain a parasitic capacitance (of a capacitor), which may be modeled as a capacitance connected to the ground. The first, second, third and fourth nodes may respectively be connected to the REFP, INP, INM and REFM signals via a first, second, third and fourth φ switches.

In operation, the four φ switches are closed during a sample phase to cause the four capacitors to be charged by a voltage level provided on the corresponding one of the INP, INM, REFM, and REFP signals. Then, during an average phase, the four φ switches may be opened and the first φZ switch may be closed to cause the voltages across the first node and the second node to be averaged to generate a first average voltage. The second φZ switch also may also be closed during the average phase to cause the voltages across the second node and the fourth node to be averaged to generate a second average voltage. In an embodiment, the parasitic capacitance of the first node is designed equal to that of the third node, and the parasitic capacitance of the second node is designed to equal that of the fourth node.

The first and second φZD switches are closed during a hold phase to cause the regenerative latches to generate a difference of the first average voltage and the second average voltage. In addition, the regenerative latches amplify the difference to generate an output signal representing the result of comparison of the differential input signal and the differential reference signal. The result may be amplified to generate a voltage level representing a logic state of a binary bit. The φZ switches also may be kept at least for a short duration during the hold phase such that the latches are connected in parallel in the hold phase.

In one embodiment, each latch contains a first amplifying element and a second amplifying element connected back-to-back. The two amplifying elements are enabled and disabled by one of the φZD switches. When enabled, the amplifying elements amplify the input signals due to the positive feedback. The amplifying elements may be implemented using logic gates such as inverter, NOR, NAND, XOR, XNOR, etc., also as is well known in the relevant arts.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention allows two differential signals to be compared, and the result of the comparison to be amplified to a desired voltage level. The output is generated by averaging one single-ended input of a first differential signal to be compared with a single-ended input of a second differential signal to generate a first average. A second average is generated based on the remaining two signals. A subtraction of the two averages is performed, and the result of the subtraction is amplified to generate the comparison result at a desired higher voltage level.

Several aspects of the invention are described below with reference to exemplary environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1:
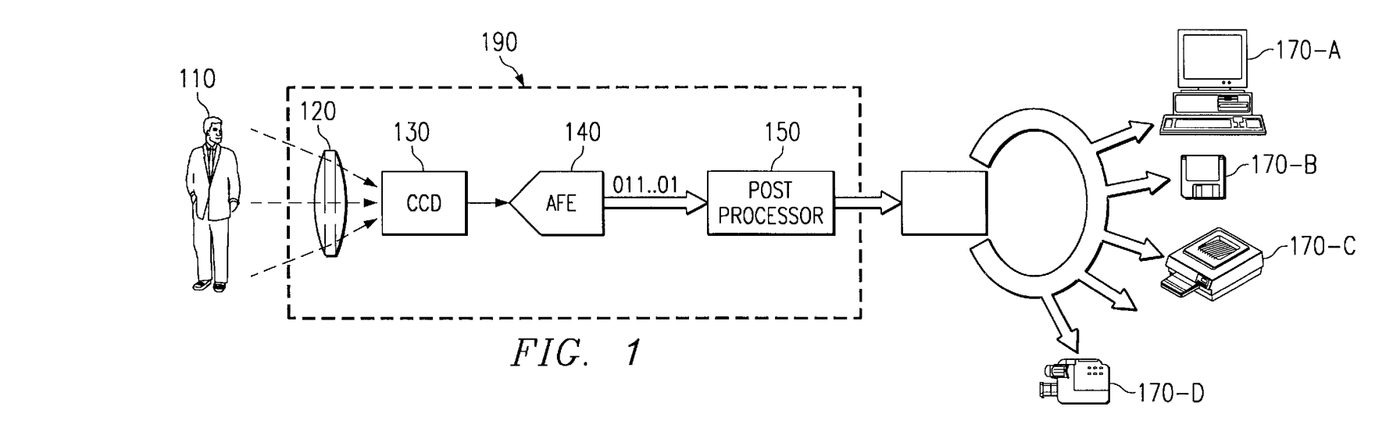
FIG. 1 is a block diagram illustrating an example of an environment in which the present invention can be implemented.

FIG. 1 is a block diagram illustrating an example of an environment in which the present invention can be implemented. There is shown light from image 110 being allowed to pass through device 190 (such as a digital camera or a scanner). The output of device can be used for further processing, printing or storing, etc., as described below in further detail.

With respect to device 190, the light from image 110 is shown being focused on CCD 130 by lens 120. CCD 130 contains several pixels which are charged proportionate to the product of the incident light intensity and the time of exposure to the light. The charge is converted into voltage in a known way and transferred to analog front-end (AFE) 140. CCD 130 is an exemplary embodiment of an image sensor.

AFE 140 may employ techniques such as correlated double sampling (which are well known in the relevant arts) to generate a voltage level corresponding to each pixel processed by AFE 140. AFE 140 may then sample the voltages to generate the digital values representing the image. Several aspects of the present invention enable AFE 140 to be implemented while minimizing the electrical power consumption as described below with examples in further detail.

Post processor 150 processes the digital values generated by AFE 140, generally to enhance the quality of image represented by the digital values and/or to convert the data into suitable format for storing. The resulting output data may be used in several ways, for example, viewed/edited by computer system 170-A, stored in floppy disk 170-B, printed on a printer 170-C or transferred to video player 170-D.

The description is continued with reference to AFE 140 which converts voltages into digital values while minimizing power consumption in accordance with several aspects of the present invention.

3. Analog Front End (AFE)

Figure 2:
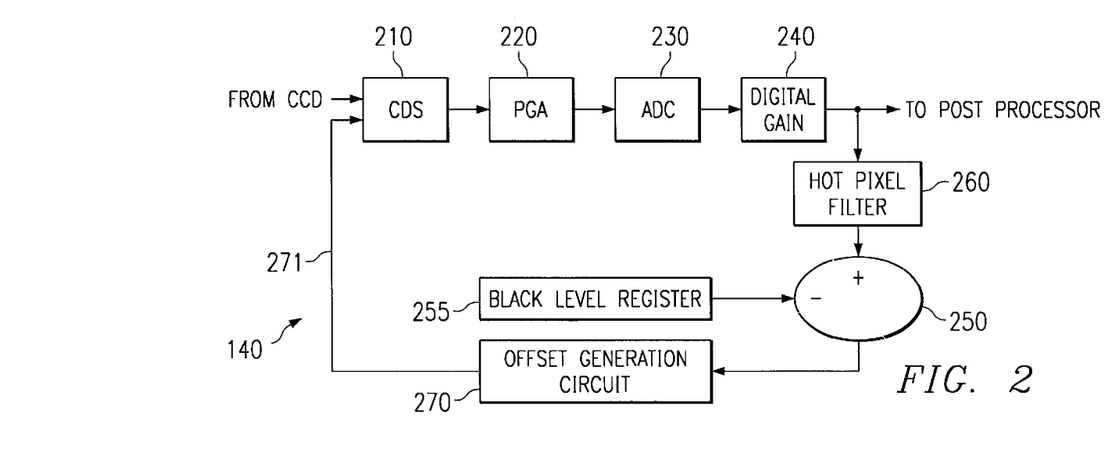
FIG. 2 is a block diagram illustrating the details of an embodiment of an analog front end provided in accordance with the present invention.

FIG. 2 is a block diagram of AFE 140 illustrating the details (in one embodiment) as relevant to an understanding of several aspects of the present invention. AFE 140 is shown containing correlated double sampler circuit (CDS) 210, programmable gain amplifier (PGA) 220, analog to digital converter (ADC) 230, digital gain 240, adder 250, black level register 255, hot pixel filter 260, offset generation circuit 270. Each component is described below in further detail.

CDS 210 receives voltage inputs from CCD 130, and performs a correlated double sampling operation. In addition, CDS 210 performs offset correction by subtracting (in analog domain) the offset (on path 271) received from offset generation circuit 270 from each of the pixel analog values. The voltage output of CDS 210 is amplified by PGA 220 by a gain specified typically by a designer depending on image 110. CDS 210 and PGA 220 may be implemented in a known way.

ADC 230 digitizes the amplified voltage signal to generate pixel digital elements. ADC 230 may contain several comparators implemented in accordance with the present invention as described below in further detail with reference to example embodiments. The pixel digital elements may again be amplified by digital gain 240, which may be implemented in a known way.

Hot pixel filter 260 may ignore 'hot pixels' (which are stuck at a high value due to, for example, manufacturing defects). In an embodiment, a value corresponding to an adjacent pixel may be substituted for each hot pixel. Adder 250 subtracts the black level value stored in black level register 255 from each pixel digital element received from digital gain 240. As is well known in the relevant arts, a designer may wish to set black/dark level to a non-zero value, and the corresponding value is subtracted from each pixel digital value.

Offset generation circuit 270 generates an offset on path 271 based on the digital values corresponding to the dark pixels received from CCD 130. The offset may be generated, for example, as described in co-pending commonly assigned patent application entitled, "Improved Offset Correction of the Output of a Charge Coupled Device", naming as inventors Kulhalli et al, filed on Dec. 21, 2000, attorney docket number: TI-31596/TXN-0007, which is incorporated in its entirety herewith.

The description is continued with reference to an exemplary implementation of ADC 230 which may generate a 14-bit output at a rate of 21 Mega-samples/second. As will be clear from the description, the embodiment is provided while minimizing electrical power consumption.

4. Analog to Digital Converter (ADC)

Figure 3:
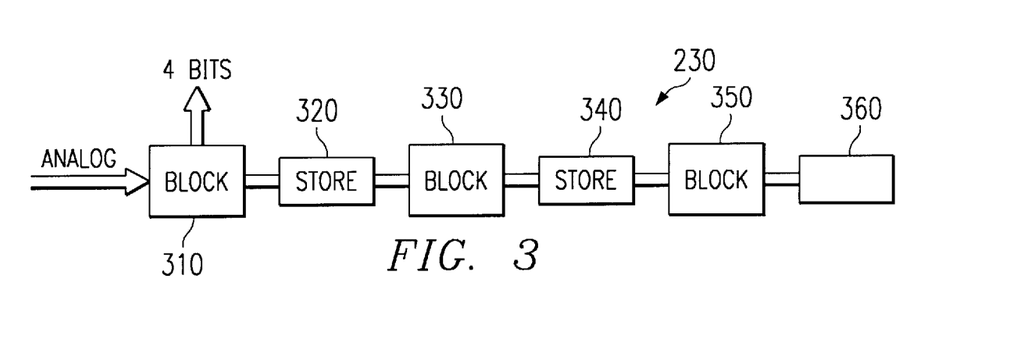
FIG. 3 is a block diagram illustrating the details of an embodiment of a pipelined analog to digital converter (ADC) in accordance with the present invention.

FIG. 3 is a block diagram illustrating the details of ADC 330 in one embodiment of the present invention. ADC 330 is shown containing three blocks 310, 330, and 350, and three storage elements 320, 340 and 360. The three blocks are respectively designed to generate (or resolve) 4, 4, and 6 bits. Two of the fourteen bits may be redundant and used to recover errors in resolution of the more significant bits in a known way.

Figure 4:
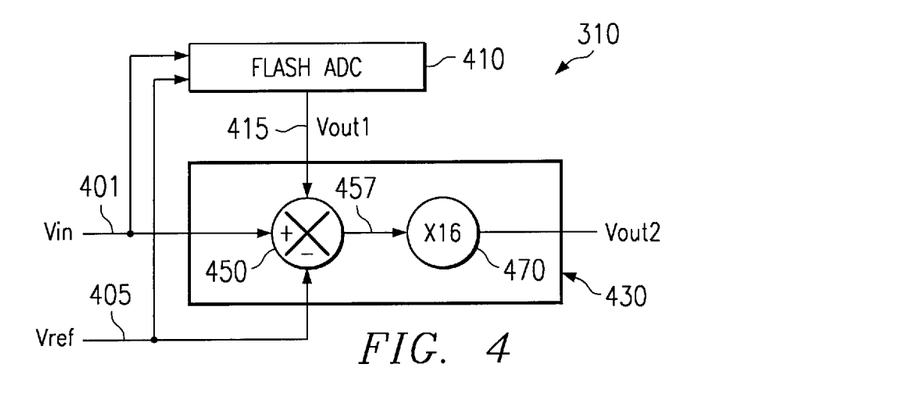
FIG. 4 is a block diagram illustrating the details of an embodiment of a block used in an ADC.

The three blocks are described with reference to block 310 for conciseness. However, several aspects of the description are applicable to other blocks as well. FIG. 4 is a block diagram illustrating the details of block 310 in one embodiment. Block 310 is shown containing a flash analog to digital converter 410, an adder/subtractor 450 and an amplifying unit 470. Each component is described below in further detail with the description of flash analog to digital converter 410 following that of adder/subtractor 430 and amplification unit 470.

Adder subtractor 450 receives the resolved value (bits) from flash ADC 410, a reference signal Vref and input signal Vin, and generates a residue analog signal 457 representing the unresolved portion of the input signal Vin. The analog residue signal (Vres) 457 may mathematically be represented by the equation:

$$Vres = Vin - (Value/Maximum\ levels) \times Vref \qquad \text{Equation (1)}$$

Wherein 'x' represents multiplication operation, 'Value' represents the value of the resolved bits, Vin represents the input voltage, Vres represents the residue voltage, and 'Maximum levels' represents the total number of divisions of the reference signal.

Amplification unit 470 amplifies the analog residue signal by a factor of 2\*\*n, wherein 'n' generally represents the number of bits resolved by flash ADC 410. Such an amplification enables all blocks to operate at the same voltage swing (peak to ground voltage) of the corresponding input signals. Thus, the output Vout2 of amplification unit 470 may be given by the following equation:

$$Vout2 = Vres \times 2^{**}n \qquad \text{Equation (2)}$$

Substituting Equation 1 in Equation 2 the following equation is obtained $$Vout2 = (Vin - (Value/Maximum\ levels) \times Vref) \times 2^{**}n$$

i.e., $Vout2 = [Vin \times 2^{**}n] - [(Value/Maximum\ levels) \times Vref \text{Equation (3)}]$ Flash analog to digital converter (ADC) 410 resolves a subset of the bits generated by ADC 220 by examining the input signal Vin. The Vref signal is also shown as being provided as an input. The manner in which an embodiment of flash ADC 410 is implemented is described below in further detail.

5. Flash Analog to Digital Converter(ADC)

Figure 5:
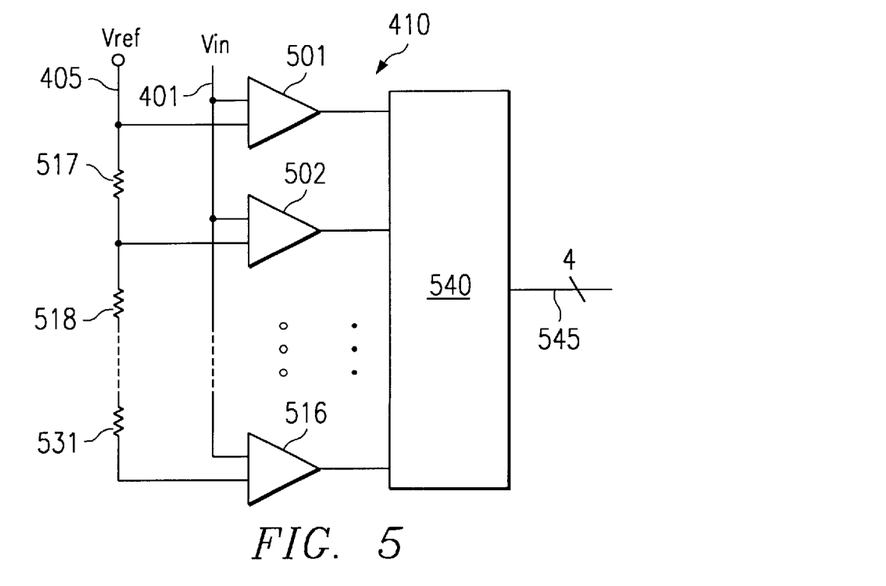
FIG. 5 is a block diagram illustrating the details of a circuit implementing a flash analog to digital converter in an embodiment of the present invention.

FIG. 5 is a block diagram illustrating the details of flash ADC 410 in one embodiment. For conciseness and clarity, a simplistic model (which ignores features such as error correction) of flash ADC 410 is being described. Flash ADC 410 is shown containing sixteen comparators 501 through 516, fifteen resistors 517 through 531, and an encoder 540. The components of flash ADC 410 are described in further detail below.

Resistors 517 through 531 (together referred as a resistor bridge) are connected in series. Resistors 517 and 531 may be respectively connected to Vref and ground as shown. The resistance of the fifteen resistors 517 through 531 may be equal. The effect is to generate equally spaced 16 fractions of the reference voltage (Vref) at the resistor junctions. The fractional voltages may be referred to as divided differential voltages. The resistor bridge may be implemented in a known way.

Each of the comparators 501 through 516 receives the input signal Vin on one input, and a corresponding divided differential voltage as the second input. A comparison operation is performed by comparators 501 through 516 and a corresponding bit is generated at their outputs. Each bit may have one logical value for one result of the comparison, and a different logical value otherwise. The sixteen bits may be provided to encoder 540. In the alternative, the sixteen bits may be provided directly to adder/subtractor 450, thereby obviating the need for encoder 540. However, adder/subtractor 450 needs to be designed consistently.

Encoder 540 receives the sixteen bits from comparators 501 through 516, and generates binary output 545. In an embodiment, encoder 540 merely counts the number of ones (or zeros) in the sixteen inputs, and the count is provided as binary output 545.

The description is continued with reference to an example implementation of comparator 510. The description may be applicable to other comparators as well. As will be clear from the description, the embodiment is provided while minimizing input offset and electrical power consumption.

6. Comparator

Figure 6:
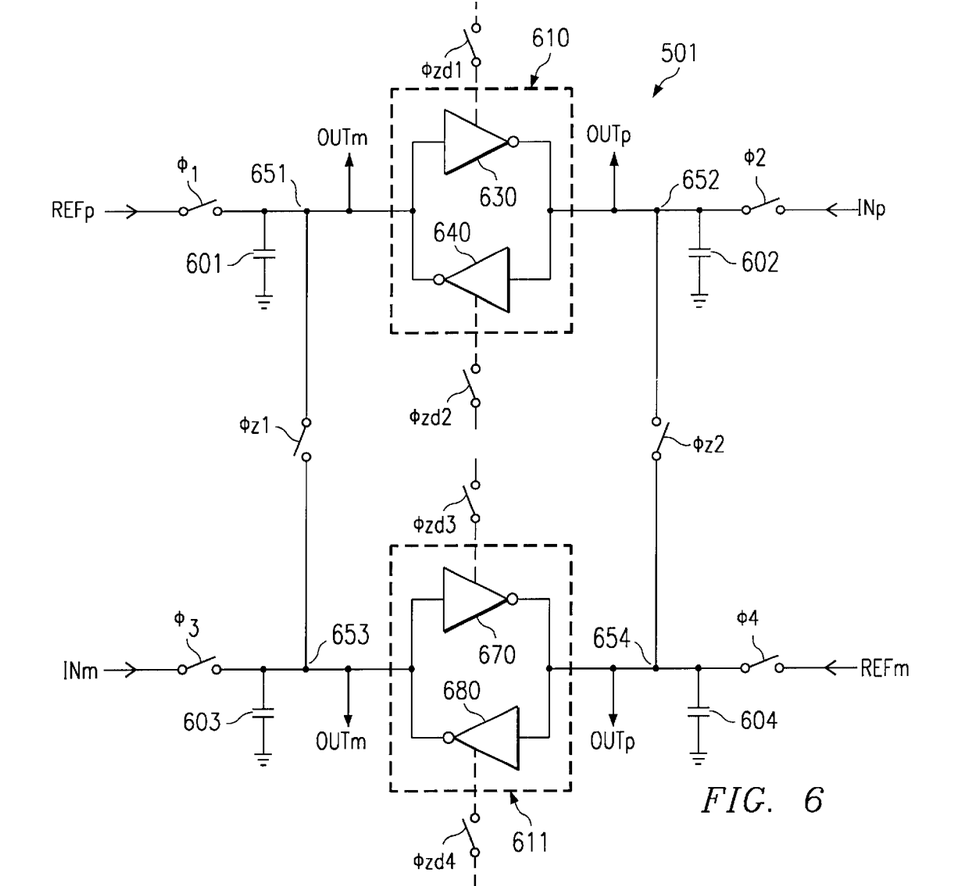
FIG. 6 is a block diagram illustrating the details of a comparator in an embodiment of the present invention.

FIG. 6 illustrates the details of comparator 501 in one embodiment. Comparator 501 compares an input signal (represented by two single ended signals INP and INM) to a reference signal (represented by REFP and REFM), and is shown containing two regenerative latches 610 and 611 which can be implemented similarly. A regenerative latch generally amplifies a signal using a positive feedback loop. Latch 610 in turn is shown containing two NOT gates 630 and 640, which are connected back-to-back. That is, the input of one gate is connected to the output of the other, and vice-versa.

NOT gates are example implementations of amplifying elements. Other examples of amplifying elements include XOR gates, XNOR, NAND gates, NOR gates. Sampling switch φ1 connects node 651 to positive reference signal REFP and sampling switch φ2 connects node 652 to positive single ended input signal INP. Similarly, sampling switch φ3 connects node 653 to negative reference input signal REFM and sampling switch φ4 connects node 654 to negative single ended input signal INM. Sampling switches φ1, φ2, φ3 and φ4 are closed during one phase of sample clock, and are open during another phase.

Averaging switch φz1 connects node 651 to node 653, and averaging switch φz2 connects node 652 to 654. Averaging switches φz1 and φz2 are controlled by the average clock described below. When closed, a switch provides connectivity to the corresponding two components. Connectivity is not present otherwise between the two components.

Enable/disable switch φzd1 may control power supply or change logic inputs of gate 630. Gates 640, 670 and 680 contain similar enable/disable switches φzd2, φzd3 and φzd4 respectively. Parasitic capacitances 601 and 602 may be present at nodes 651 and 652 respectively. Similar parasitic capacitances (603 and 604) may also be present at nodes 653 and 654.

Figure 7:
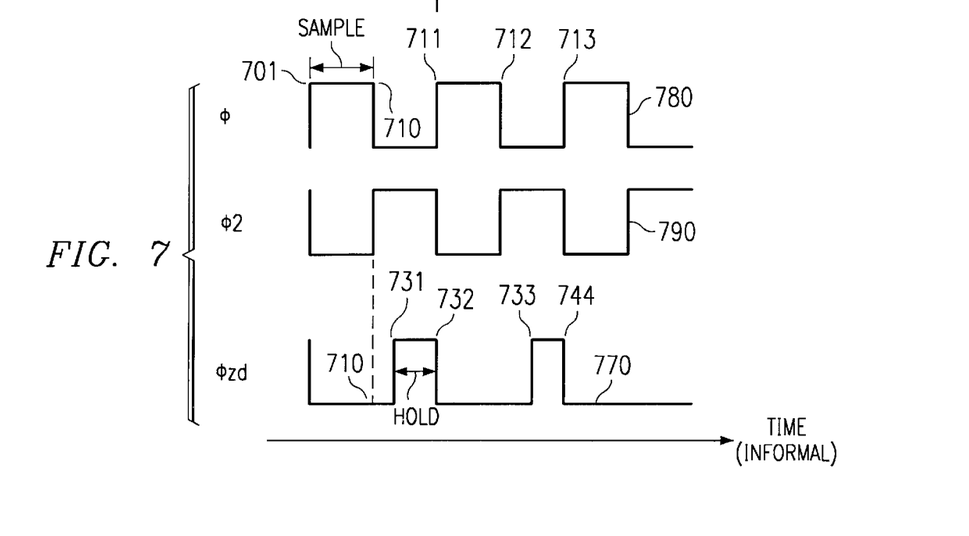
FIG. 7 is a timing diagram illustrating the sample, average and hold phases of a clock signal in an embodiment of the present invention.

The operation of comparator 501 is described in further with combined reference to FIGS. 6 and 7. FIG. 7 is a timing diagram of three clock signal φ 780, φZ 790, and φzd 770 which respectively drive the sets of switches {φ1, φ2, φ3, and φ4} (referred to as the four φ switches), {φz1, and φz2} (φZ switches), and {φzd1, and φzd2} (φzd switches). The operation of comparator 501 may be viewed as containing three stages - the sampling phase (controlled by φ 780), the averaging phase (controlled by φz 790) and the hold phase (controlled by φzd 770).

During the sampling phase, sampling switches φ1, φ2, φ3 and φ4 are on (closed) causing the corresponding input voltages to be get sampled on to the parasitic capacitances 601, 602, 603 and 604. Sampling phase generally refers to the duration when signal φ 780 is high, and an example sample phase is between time points 710 and 711 of FIG. 7.

During the average phase, switches φz1 and φz are on, thus shorting inputs INM, REFP and INP, REFM respectively. The charges corresponding to INP and REFM are averaged and also those corresponding to INM and REFP. It may be noted that the averaging phase can be fairly short (e.g., between time points 710 and 731) and can end before the beginning of the hold phase. However, the averaging phase is shown overlapping between time points 731 and 732. The overlap enables the two latches to operate logically as a single latch during amplification, and provide the same logical output.

Assuming the parasitic capacitances (602 and 604) to be equal, the voltages v1 corresponding to the shorted nodes 652 and 654 may be calculated by the mathematical equation as follows:

$$Q_{INP} = V_{INP} \times Cp \qquad \text{Equation (4)}$$

wherein '$Q_{INP}$' is the charge that may be present at node 652 (represented by capacitor 602)
'$V_{INP}$' is the positive input voltage on signal line INP and 'Cp' is the capacitance on capacitor 602.

Similarly the charge at node 654 can be calculated by the following equation:

$$Q_{REFM} = V_{REFM} \times Cp \qquad \text{Equation (5)}$$

wherein '$Q_{REFM}$' is the charge that may be present at node 654
'$V_{REFM}$' is the negative reference voltage on signal line REFM
and 'Cp' is the capacitance of capacitor 604.

The average voltage v1 at node 652 (at the end of hold phase) is calculated by the equation $$v1 = [(V_{INP} \times Cp) + (V_{REFM} \times Cp)]/2Cp \qquad \text{Equation (6)}$$
$$= (V_{INP} + V_{REFM})/2$$

Similarly, average voltage v1 at node 651 is calculated by the equation $$v1 = [(V_{INM} \times Cp) + (V_{REFP} \times Cp)]/2 \qquad \text{Equation (7)}$$
$$= (V_{INM} + V_{REFP})/2$$

Wherein $V_{INM}$ represents the voltage received on line INM;
$V_{REFP}$ represents the voltage received on line REFP;
and $C_p$ represents the parasitic capacitance at nodes 651 and 653.

During the hold phase, the enable switches φzd1, φzd2, φzd3 and φzd4 are turned on as represented by the higher level (e.g., between time points 731 and 732) of φ2d770. Regenerative latches 610 and 611 are now effectively in parallel and compare the previously averaged voltages v1 and v1 as is well known in the relevant arts. Comparison leads to a subtraction operation which may be represented by the following equation:

$$[(V_{INP}+V_{REFM})/2]-[(V_{INM}+V_{REFP})/2] \text{ i.e., } (V_{INP}-V_{INM})-(V_{REFP}-V_{REFM})]/2 \qquad \text{Equation (8)}$$

As may be readily observed, $(V_{INP}-V_{INM})$ represents the differential input signal, and $(V_{REFP}-V_{REFM})$ represents the differential reference signal. The term of equation (8) thus represents a difference (comparison) of the differential input signal and the differential reference signal.

Differential output voltage represented by Equation 8 regenerates and may swing to the logic levels quickly thus attaining required amplification. The hold duration (e.g., between time points between 731 and 732) needs to be designed to ensure that the voltage level swings to a desired degree. The OUTP or OUTM output shown respectively at the nodes 652 and 651 represent the output voltage generated by comparator 501.

In comparison to the double differential amplifier embodiment noted in the background section of above, comparator 501 may consume less electrical power as a pre-amplifier may not be necessary. Accordingly, the present invention can be used to implement comparators while minimizing power consumption.

9. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A comparator circuit for comparing a differential input voltage with a differential reference voltage, wherein said differential input signal is represented by a negative single ended signals (INM) and a positive single ended signal (INP), said differential reference voltage being represented by a negative single ended signal (REFM) and a positive single ended signal (REFP), said comparator circuit comprising;

a first regenerative latch coupled between a first node and a second node;

a second regenerative latch coupled between a third node and a fourth node, said first node being connected to said third node by a first φZ switch and said second node being connected to said fourth node by a second φZ switch, said first regenerative latch being enabled and disabled according to a first φZD switch and said second regenerative latch being enabled and disabled according to a second φZD switch;

a first capacitor having a first terminal and a second terminal, said first terminal of said first capacitor being coupled to said REFP via a first φ switch, said first terminal of said first capacitor also being coupled to said first node;

a second capacitor having a first terminal and a second terminal, said first terminal of said second capacitor being coupled to said INP via a second φ switch, said first terminal of said second capacitor also being coupled to said second node;

a third capacitor having a first terminal and a second terminal, said first terminal of said third capacitor being coupled to said INM via a third φ switch, said first terminal of said third capacitor also being coupled to said third node;

a fourth capacitor having a first terminal and a second terminal, said first terminal of said fourth capacitor being coupled to said REFM via a fourth φ switch, said first terminal of said fourth capacitor also being coupled to said fourth node;

wherein said four φ switches are closed during a sample phase to cause said four capacitors to be charged by a voltage level provided on the corresponding one of the INP, INM, REFM, and REFP signals, wherein said first φZ switch is closed during an average phase to cause the voltages across said first node and said second node to be averaged to generate a first average voltage, said second φZ switch also being closed during said hold phase to cause the voltages across said second node and said fourth node to be averaged to generate a second average voltage, and wherein said first and second φZD switches are closed during a hold phase to cause said regenerative latches to generate a difference of said first average voltage and said second average voltage, said first regenerative latch and said second regenerative latch amplifying said difference to generate an output signal representing the result of comparison of said differential input signal and said differential reference signal.

2. The comparator circuit of claim 1, wherein each of said four capacitors represents a parasitic capacitance of a corresponding one of said four nodes.

3. The comparator circuit of claim 1, wherein at least one of said latches comprises a first amplifying and a second amplifying connected back-to-back, wherein said first amplifying and said second amplifying are enabled and disabled by one of said φZD switches.

4. The comparator circuit of claim 3, wherein each of said first amplifying and said second amplifying comprise an inverter.

5. The comparator circuit of claim 3, wherein the capacitance of said first capacitor equals the capacitance of said third capacitor, and wherein the capacitance of said second capacitor equals the capacitance of said fourth capacitor.

6. The invention of claim 3, wherein said comparator circuit is implemented in an analog to digital converter (ADC), wherein said ADC is in turn implemented in a charged coupled device (CCD) camera.

7. An analog front end (AFE) receiving a sequence of voltages representing the corresponding charges stored in a plurality of pixels contained in an image sensor, said AFE generating a plurality of digital values representing said sequence of voltages, said AFE comprising:

a sampler receiving the charge stored in said plurality of pixels and generating a voltage level corresponding to each charge, said voltage level being generated after correction according to a previous offset;

a programmable gain amplifier (φGA) amplifying said voltage level to generate an amplified voltage level;

an analog to digital converter (ADC) converting said amplified voltage level to a digital value, said ADC containing a comparator circuit for comparing a differential input voltage representing a charge in one of said plurality of pixels, said differential input voltage signal being represented by a differential reference voltage, wherein said differential input signal is represented by a negative single ended input signal (INM) and a positive single ended input signal (INP), said differential reference voltage being represented by a negative reference signal (REFM) and a positive reference signal (REFP), said comparator circuit comprising:

a first regenerative latch coupled between a first node and a second node;

a second regenerative latch coupled between a third node and a fourth node, said first node being connected to said third node by a first φZ switch and said second node being connected to said fourth node by a second φZ switch, said first regenerative latch being enabled and disabled according to a first φZD switch and said second regenerative latch being enabled and disabled according to a second φZD switch;

a first capacitor having a first terminal and a second terminal, said first terminal of said first capacitor being coupled to said REFP via a first φ switch, said first terminal of said first capacitor also being coupled to said first node;

a second capacitor having a first terminal and a second terminal, said first terminal of said second capacitor being coupled to said INP via a second φ switch, said first terminal of said second capacitor also being coupled to said second node;

a third capacitor having a first terminal and a second terminal, said first terminal of said third capacitor being coupled to said INM via a third φ switch, said first terminal of said third capacitor also being coupled to said third node;

a fourth capacitor having a first terminal and a second terminal, said first terminal of said fourth capacitor being coupled to said REFM via a fourth φ switch, said first terminal of said fourth capacitor also being coupled to said fourth node;

wherein said four φ switches are closed during a sample phase to cause said four capacitors to be charged by a voltage level provided on the corresponding one of the INP, INM, REFM, and REFP signals, wherein said first φZ switch is closed during an average phase to cause the voltages across said first node and said second node to be averaged to generate a first average voltage said second φZ switch also being closed during said hold phase to cause the voltages across said second node and said fourth node to be averaged to generate a second average voltage, and wherein said first and second φZD switches are closed during a hold phase to cause said regenerative latches to generate a difference of said first average voltage and said second average voltage, said first regenerative latch and said second regenerative latch amplifying said difference to generate an output signal representing the result of comparison of said differential input signal and said differential reference signal, wherein said output signal represents a bit of one of said digital values.

8. The AFE of claim 7, further comprising:

an offset generation circuit generating a corrected offset value and providing said corrected offset value as said previous offset, whereby said error value converges quickly to a desired minimum error sought to be achieved due to said correction according to said exponential curve.

9. The AFE of claim 7, wherein each of said four capacitors represents a parasitic capacitance of a corresponding one of said four nodes.

10. The AFE of claim 7, wherein at least one of said latches comprises a first amplifying and a second amplifying connected back-to-back, wherein said first amplifying and said second amplifying are enabled and disabled by one of said φZD switches.

11. The AFE of claim 10, wherein each of said first amplifying and said second amplifying comprise an inverter.

12. The AFE of claim 10, wherein the capacitance of said first capacitor equals the capacitance of said third capacitor, and wherein the capacitance of said second capacitor equals the capacitance of said fourth capacitor.

13. The AFE of claim 10, wherein said ADC comprises a plurality of comparators, each of said plurality of comparators comprising said comparator, wherein said plurality of comparators together generate said digital value.

14. A device receiving light from an image, and generating a plurality of digital values representing said image based on said light, said device comprising:

an image sensor containing a plurality of pixels, each of said plurality of pixels generating a charge proportionate to incident light and time of incidence of light, wherein said light from said image is incident on said image sensor;

an analog front end (AFE) receiving a sequence of voltages representing the corresponding charges stored in said plurality of pixels, said AFE generating said plurality of digital values representing said sequence of voltages, said AFE comprising:

a sampler receiving the charge stored in said plurality of pixels and generating a voltage level corresponding to each charge, said voltage level being generated after correction according to a previous offset;

a programmable gain amplifier (PGA) amplifying said voltage level to generate an amplified voltage level;

an analog to digital converter (ADC) converting said amplified voltage level to a digital value, said ADC containing a comparator circuit for comparing a differential input voltage representing a charge in one of said plurality of pixels, said differential input voltage signal being represented by a differential reference voltage, wherein said differential input signal is represented by a negative single ended input signal (INM) and a positive single ended input signal (INP), said differential reference voltage being represented by a negative reference signal (REFM) and a positive reference signal (REFP), said comparator circuit comprising:

a first regenerative latch coupled between a first node and a second node;

a second regenerative latch coupled between a third node and a fourth node, said first node being connected to said third node by a first φZ switch and said second node being connected to said fourth node by a second φZ switch, said first regenerative latch being enabled and disabled according to a first φZD switch and said second regenerative latch being enabled and disabled according to a second φZD switch;

a first capacitor having a first terminal and a second terminal, said first terminal of said first capacitor being coupled to said REFP via a first φ switch, said first terminal of said first capacitor also being coupled to said first node;

a second capacitor having a first terminal and a second terminal, said first terminal of said second capacitor being coupled to said INP via a second φ switch, said first terminal of said second capacitor also being coupled to said second node;

a third capacitor having a first terminal and a second terminal, said first terminal of said third capacitor being coupled to said INM via a third φ switch, said first terminal of said third capacitor also being coupled to said third node;

a fourth capacitor having a first terminal and a second terminal, said first terminal of said fourth capacitor being coupled to said REFM via a fourth φ switch, said first terminal of said fourth capacitor also being coupled to said fourth node;

wherein said four φ switches are closed during a sample phase to cause said four capacitors to be charged by a voltage level provided on the corresponding one of the INP, INM, REFM, and REFP signals, wherein said first φZ switch is closed during an average phase to cause the voltages across said first node and said second node to be averaged to generate a first average voltage, said second φZ switch also being closed during said hold phase to cause the voltages across said second node and said fourth node to be averaged to generate a second average voltage, and wherein said first and second φZD switches are closed during a hold phase to cause said regenerative latches to generate a difference of said first average voltage and said second average voltage, said first regenerative latch and said second regenerative latch amplifying said difference to generate an output signal representing the result of comparison of said differential input signal and said differential reference signal, wherein said output signal represents a bit of one of said plurality of digital values.

15. The device of claim 14, further comprising:

an offset generation circuit generating a corrected offset value and providing said corrected offset value as said previous offset, whereby said error value converges quickly to a desired minimum error sought to be achieved due to said correction according to said exponential curve.

16. The device of claim 14, wherein each of said four capacitors represents a parasitic capacitance of a corresponding one of said four nodes.

17. The device of claim 14, wherein at least one of said latches comprises a first amplifying and a second amplifying connected back-to-back, wherein said first amplifying and said second amplifying are enabled and disabled by one of said φZD switches.

18. The device of claim 17, wherein each of said first amplifying and said second amplifying comprise an inverter.

19. The device of claim 17, wherein the capacitance of said first capacitor equals the capacitance of said third capacitor, and wherein the capacitance of said second capacitor equals the capacitance of said fourth capacitor.

20. The invention of claim 14, wherein said device comprises either a camera or a scanner.

21. A circuit for comparing an input differential signal with a reference differential signal, each differential signal being represented by a pair of single ended inputs, said circuit comprising:

means for adding, to generate an average, a first one of said pair of single ended inputs related to said input differential signal to a first one of said pair of single ended inputs related to said reference differential signal to generate a first added signal;

means for adding, to generate an average, a second one of said pair of single ended inputs related to said input differential signal to a second one of said pair of single ended inputs related to said reference differential signal to generate a second added signal;

means for generating a difference of said first added value and said second added value; and means, comprising a positive feedback loop, for amplifying said difference to generate an amplified signal representing the result of comparison of said reference differential signal and said input differential signal, wherein said first one of said pair of single ended inputs related to said input differential signal and said first one of said pair of single ended inputs related to said reference differential signal are of opposite polarities.

22. A method of comparing an input differential signal with a reference differential signal, each differential signal being represented by a pair of single ended inputs, said method comprising:

adding, by generating an average using a capacitor, a first one of said pair of single ended inputs related to said input differential signal to a first one of said pair of single ended inputs related to said reference differential signal to generate a first added signal;

adding, by generating an average using a capacitor, a second one of said pair of single ended inputs related to said input differential signal to a second one of said pair of single ended inputs related to said reference differential signal to generate a second added signal;

generating a difference of said first added value and said second added value; and amplifying, using a positive feedback loop, said difference to generate an amplified signal representing the result of comparison of said reference differential signal and said input differential signal, wherein said first one of said pair of single ended inputs related to said input differential signal and said first one of said pair of single ended inputs related to said reference differential signal are of opposite polarities.

23. The method of claim 22, wherein each of said single ended inputs comprises a voltage signal.

24. The invention of claim 22, wherein said method is implemented in an analog to digital converter (ADC) of a CCD camera.

* * * * *